(12) United States Patent
Oner et al.

(10) Patent No.: US 11,824,391 B2
(45) Date of Patent: Nov. 21, 2023

(54) CONTROLLED TRANSITION TO REGULATION

(71) Applicant: TEXAS INSTRUMENTS INCORPORATED, Dallas, TX (US)

(72) Inventors: Hakan Oner, San Jose, CA (US); Kevin Scoones, San Jose, CA (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 123 days.

(21) Appl. No.: 16/860,914

(22) Filed: Apr. 28, 2020

(65) Prior Publication Data
US 2021/0336445 A1 Oct. 28, 2021

(51) Int. Cl.
    H03F 1/14    (2006.01)
    H02J 7/00    (2006.01)
    H03F 3/347   (2006.01)

(52) U.S. Cl.
    CPC ............ H02J 7/007 (2013.01); H02J 7/0029 (2013.01); H02J 7/0047 (2013.01); H03F 3/347 (2013.01);
    (Continued)

(58) Field of Classification Search
    CPC ........ H02J 7/007; H02J 7/0029; H02J 7/0047; H02J 7/00304; H02J 7/00308; H02J 7/0031; H02J 7/007182; H03F 3/347; H03F 2200/228; H03F 2200/234; H03F 2200/267; H03F 3/45183; H03F 3/45179; H03F 3/45192; H03F 3/45089; H03F 3/72; H03F 1/0277; H03F 3/45475; H03F 2203/45138;
    (Continued)

(56) References Cited

U.S. PATENT DOCUMENTS

| 4,952,864 A | 8/1990 | Pless et al. |
| 7,564,216 B2 | 7/2009 | Carrier et al. |

(Continued)

FOREIGN PATENT DOCUMENTS

WO    2017043979 A1    3/2017

OTHER PUBLICATIONS

International Search Report dated Jul. 22, 2021, PCT Application No. PCT/US2021/029048, 2 pages.

(Continued)

*Primary Examiner* — Khanh V Nguyen
(74) *Attorney, Agent, or Firm* — Michelle F. Murray; Frank D. Cimino

(57) ABSTRACT

A device includes an amplifier having inverting and non-inverting inputs and an output. The device includes a capacitor coupled to a first node and to ground, a resistor coupled to the first node and the amplifier output, and a first switch coupled to the first node and a current sink, which is coupled to ground. The device includes AND gate having inputs and an output coupled to control terminal of first switch. The device includes a first comparator having non-inverting and inverting inputs and an output coupled to an AND gate input; a second comparator having a non-inverting input coupled to the amplifier output, an inverting input coupled to a transistor stack, and an output coupled to an AND gate input; and a second switch coupled to the transistor stack and to a current source, the second switch having a control terminal coupled to the first comparator output.

23 Claims, 5 Drawing Sheets

(52) U.S. Cl.
CPC .. *H03F 2200/228* (2013.01); *H03F 2200/234* (2013.01); *H03F 2200/267* (2013.01)

(58) Field of Classification Search
CPC ... H03F 3/45479; H03F 3/195; H03G 1/0088; H01L 2924/3011; H01L 23/66
USPC .......................................... 330/51, 69, 307
See application file for complete search history.

(56) References Cited

U.S. PATENT DOCUMENTS

| | | | |
|---|---|---|---|
| 8,989,306 B1 | 3/2015 | Yeung et al. | |
| 9,553,461 B2 * | 1/2017 | Amemiya | H02J 7/0029 |
| 9,673,701 B2 | 6/2017 | Mohtashemi et al. | |
| 9,857,815 B2 * | 1/2018 | Caracciolo | H03K 5/24 |
| 10,505,361 B2 * | 12/2019 | Duan | H02H 7/1213 |
| 2020/0050224 A1 | 2/2020 | Vakilian et al. | |

OTHER PUBLICATIONS

Written Opinion dated Jul. 22, 2021, PCT Application No. PCT/US2021/029048, 5 pages.

* cited by examiner

CONTROLLED TRANSITION TO REGULATION

SUMMARY

In accordance with at least one example of the disclosure, a device includes an operational transconductance amplifier having an inverting input configured to couple to a battery parameter feedback node having a voltage indicative of a parameter provided to a battery; a non-inverting input configured to couple to a battery parameter regulation voltage source; and an output. The device also includes a capacitor coupled to a first node and to a ground node, a resistor coupled to the first node and to the output of the operational transconductance amplifier, and a first switch coupled to the first node and to a current sink. The current sink is also coupled to the ground node. The device includes an AND gate having a first input, a second input, and an output, the output of the AND gate coupled to a control terminal of the first switch. The device also includes a first comparator having a non-inverting input configured to couple to the battery parameter feedback node, an inverting input configured to couple to a battery parameter threshold voltage source, and an output coupled to the first input of the AND gate. The device includes a second comparator having a non-inverting input coupled to the output of the operational transconductance amplifier; an inverting input coupled to a transistor stack, which transistor stack is also coupled to the ground node; and an output coupled to the second input of the AND gate. The device further includes a second switch coupled to the transistor stack and to a current source, the second switch having a control terminal coupled to the output of the first comparator.

In accordance with another example of the disclosure, a device includes a first operational transconductance amplifier having an inverting input configured to couple to a battery current feedback node having a voltage indicative of a current provided to a battery, a non-inverting input configured to couple to a battery current regulation voltage source, and an output. The device also includes a second operational transconductance amplifier having an inverting input configured to couple to a battery voltage feedback node having a voltage indicative of a voltage provided to a battery, a non-inverting input configured to couple to a battery voltage regulation voltage source, and an output. The device also includes a capacitor coupled to a first node and to a ground node, a resistor coupled to the first node and to the output of each of the operational transconductance amplifiers, and a first switch coupled to the first node and to a current sink. The current sink is also coupled to the ground node. The device also includes an AND gate having a first input, a second input, and an output, the output of the AND gate coupled to a control terminal of the first switch; an OR gate having a first input, a second input, and an output, the output of the OR gate coupled to the first input of the AND gate; and a first comparator having a non-inverting input configured to couple to the battery current feedback node, an inverting input configured to couple to a battery current threshold voltage source, and an output coupled to the first input of the OR gate. The device also includes a second comparator having a non-inverting input configured to couple to the battery voltage feedback node, an inverting input configured to couple to a battery voltage threshold voltage source, and an output coupled to the second input of the OR gate. The device also includes a third comparator having a non-inverting input coupled to the output of each of the operational transconductance amplifiers; an inverting input coupled to a transistor stack, wherein the transistor stack is also coupled to the ground node; and an output coupled to the second input of the AND gate. Finally, the device includes a second switch coupled to the transistor stack and to a current source, the second switch having a control terminal coupled to the output of the first comparator.

In accordance with yet another example of the disclosure, a device includes an operational transconductance amplifier configured to generate a current at an output, where the current is based on a voltage indicative of a parameter provided to a battery and a voltage provided by a battery parameter regulation voltage source. The device also includes a capacitor coupled to the output of the operational transconductance amplifier and to a ground node; a first switch coupled to the capacitor and to a current sink, where the current sink is also coupled to the ground node; and an AND gate having a first input, a second input, and an output, the output of the AND gate coupled to a control terminal of the first switch. The device also includes a first comparator configured to assert an output in response to the voltage indicative of the parameter being greater than a battery parameter threshold, where the output of the first comparator is coupled to the first input of the AND gate; a second comparator configured to assert an output in response to a voltage at the output of the operational transconductance amplifier being greater than a voltage across a transistor stack, where the transistor stack is also coupled to the ground node and the output of the second comparator is coupled to the second input of the AND gate; and a second switch coupled to the transistor stack and to a current source, the second switch having a control terminal coupled to the output of the first comparator.

BRIEF DESCRIPTION OF THE DRAWINGS

For a detailed description of various examples, reference will now be made to the accompanying drawings in which.

DETAILED DESCRIPTION

Various mobile electronic devices, such as smartphones, laptop computers, and other mobile computing devices, are powered using batteries. Charging a battery is a difficult and possibly dangerous task, as overcharging can result in excessive temperatures, fires, or explosions, and undercharging can compromise long-term battery performance. In particular, large voltage and/or current spikes during battery charging are suboptimal for battery safety and performance.

A battery charging regulating circuit operates to regulate a voltage and/or current supplied to a battery during charging or a voltage supplied to the device system electronics (e.g., microprocessors). The battery charging regulating circuit operates to protect the battery against voltage and/or current transients, or excursions from a particular range of values. In some examples, such voltage and/or current transients are introduced by a wall adapter to which the battery charging regulating circuit is coupled, or by the system powered by the battery. After the battery charging regulating circuit detects a parameter (e.g., voltage and/or current) excursion outside of the range of values, it is desirable to reduce the time to bring the parameter back into the range of values, while also reducing overshoots or undershoots in the regulated parameter.

Examples of this disclosure include a device including a regulating integrated circuit (IC) that more rapidly brings a regulated parameter that experiences an excursion outside of a range of values back to its regulation region (e.g., back into the range of values), while also reducing the undershoot or overshoot of the regulated parameter. In the particular example where the regulated parameter is a battery voltage and/or battery current, the more rapid return of a regulated parameter to its regulation region allows the battery charging regulation integrated circuit of this disclosure to reduce the likelihood of triggering more severe over-voltage, under-voltage, and/or over-current protections (e.g., turning off the power converter) that are used to protect the battery.

Figure 1:
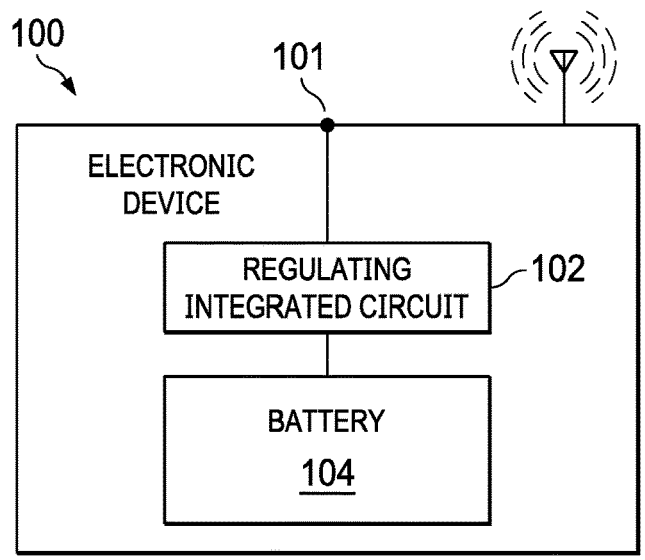
FIG. 1 shows a block diagram of an example battery-powered electronic device comprising a battery and a regulating integrated circuit (IC) in accordance with an example.

FIG. 1 depicts a block diagram of an example electronic device 100, such as a mobile device (e.g., a smartphone). The electronic device 100 comprises a battery 104 and a regulating IC 102 coupled to the battery 104. The battery 104 is any suitable type of battery that is capable of providing power to the electronic device 100 to enable the electronic device 100 to perform its intended functions. In an example, the regulating IC 102 is a single chip housed inside a package. In an example, the regulating circuitry is distributed across multiple chips, with all such chips housed inside a single package. Other variations on the precise configuration of the regulating IC 102 are contemplated and included within the scope of this disclosure. The regulating IC 102 couples to a port 101, which is configured to couple to a power supply (not pictured). For example, a user is able to connect the port 101 to mains power via an adapter. FIG. 1 is merely an example electronic device 100 in which the regulating IC 102 can be implemented. Other applications, which include various other devices that use rechargeable batteries, or devices for which regulating a parameter is useful, will also benefit from the regulating IC 102.

In operation, the regulating IC 102 receives power via the port 101 and uses the power to charge the battery 104. Specifically, the regulating IC 102 implements the techniques alluded to above and described in greater detail below to quickly transition a regulated parameter back to its regulation region, while reducing undershoot or overshoot of the regulated parameter, when charging the battery 104. In the example of FIG. 1, the more rapid return of battery 104 voltage or battery 104 current to its regulation region enabled by the regulating IC 102 reduces the likelihood of triggering more severe over-voltage, under-voltage, and/or over-current protections (e.g., turning off power circuitry of the regulating IC 102 to isolate the battery 104 from the port 101) that are used to protect the battery 104.

Figure 2A:
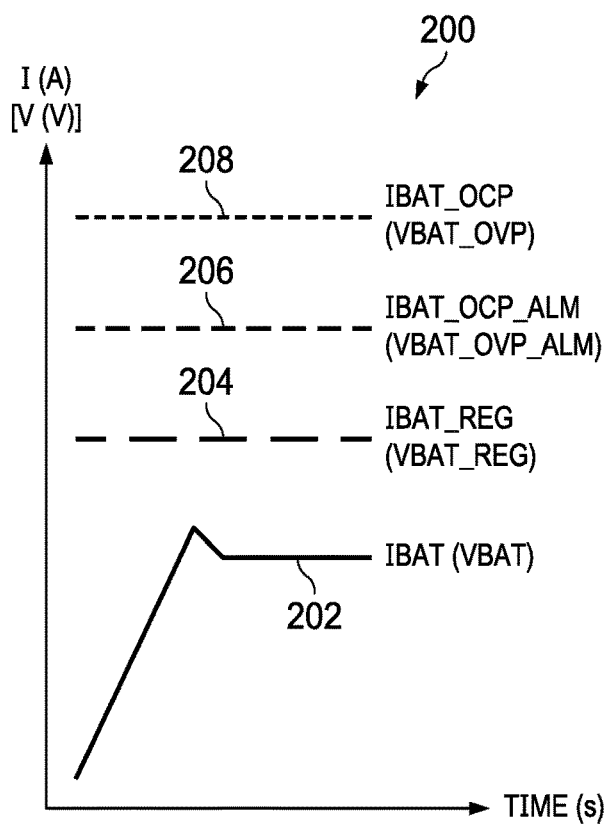
FIGS. 2a-2c show example waveforms demonstrating a regulated parameter relative to various regulation regions and excursions therefrom in accordance with an example.
Figure 2C:
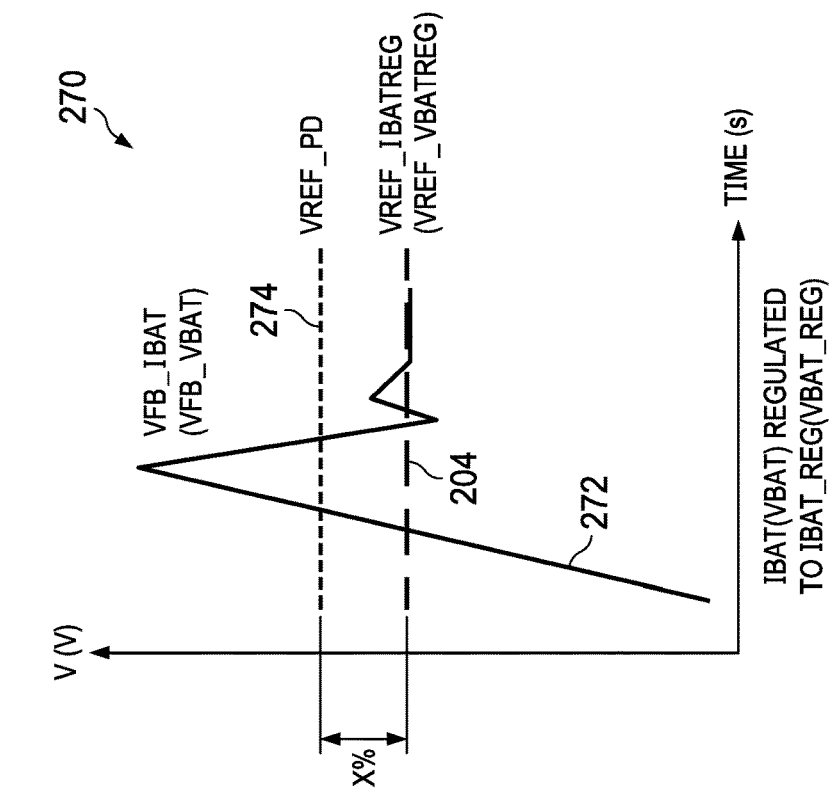
Figure 2B:
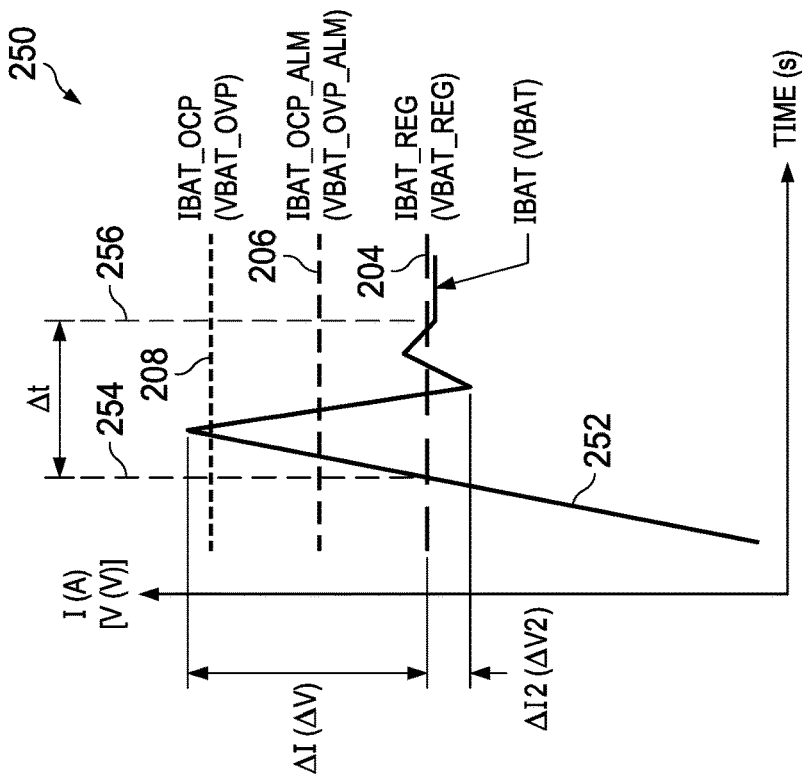

FIGS. 2a, 2b, and 2c show sets of waveforms 200, 250, 270, respectively, which demonstrate the behavior of a regulated parameter (e.g., a voltage) with respect to a regulation value (e.g., a voltage value) and excursion threshold values (e.g., a voltage value) as a function of time. Referring first to FIG. 2a, the set of waveforms 200 includes a waveform that represents a value of a regulated parameter 202 as a function of time. In some examples, the parameter 202 is one of a battery 104 voltage (VBAT) or a battery 104 current (IBAT). In one example where the parameter 202 is a battery 104 current, the parameter 202 is still a voltage value, such as a voltage across a current sense resistor, explained further below. In the example of FIG. 2a, the parameter 202 is at a value below a regulation value 204 (IBAT_REG or VBAT_REG), and thus the parameter 202 is unregulated (e.g., the regulating IC 102 is not employed to further regulate the parameter 202).

Referring now to FIG. 2b, first and second excursion threshold values 206, 208 are shown. The first excursion threshold value 206 is also labeled IBAT_OCP_ALM or VBAT_OVP_ALM, which will be explained further below. The second excursion threshold value 208 is also labeled IBAT_OCP or VBAT_OVP, which will be explained further below. For consistency, these excursion threshold values 206, 208 are also shown in FIG. 2a, although they are not implicated in FIG. 2a as a result of the parameter 202 remaining below the regulation value 204. Referring to the specific example where the parameter 252 is one of a battery 104 voltage or a battery 104 current, the excursion threshold values 206, 208 represent values of the voltage or current that the battery 104 should not exceed for more than a threshold amount of time. In one example, it is permissible for the battery 104 voltage or current to exceed the first excursion threshold 206 (IBAT_OCP_ALM or VBAT_OVP_ALM) for a first amount of time, while it is permissible for the battery 104 voltage or current to exceed the second excursion threshold 208 (IBAT_OCP or VBAT_OVP) for a second amount of time, which is less than the first amount of time. In another example, it is permissible for the battery 104 voltage or current to exceed the first excursion threshold 206 (IBAT_OCP_ALM or VBAT_OVP_ALM) for a first amount of time, while it is not permissible for the battery 104 voltage or current to exceed the second excursion threshold 208 (IBAT_OCP or VBAT_OVP) for any amount of time. In this example, the battery 104 voltage or current exceeding the second excursion threshold 208 is a fault that triggers a more severe protection circuitry, such as turning off power circuitry of the regulating IC 102 to isolate the battery 104 from the port 101 to further protect the battery 104. In one example, the first excursion threshold 206 is an alarm threshold that, when exceeded, causes an interrupt to be generated that functions to reduce the battery 104 current and/or voltage to avoid reaching the second excursion threshold 208. However, the process to decrease a current and/or voltage supplied to the battery 104, which requires detecting the excursion, generating the interrupt, and waiting for the interrupt to be serviced, is relatively slow. Continuing this example, the second excursion threshold 208 is an overvoltage or overcurrent threshold that, when exceeded, ceases charging of the battery 104. When the second excursion threshold 208 is exceeded, charging is stopped and a start-up sequence is performed in order to resume charging the battery 104.

Still referring to FIG. 2b, the parameter 252 exceeds the regulation value 204 at time 254. The overshoot of the parameter 252 beyond the regulation value 204 is shown as $\Delta V_1$ or $\Delta I_1$, depending on whether the parameter 252 represents battery 104 voltage or current, respectively. As explained above, when the parameter 252 exceeds the first excursion threshold 206, an interrupt is generated that causes the current or voltage supplied to the battery 104 to be reduced. However, due to the delay in processing the interrupt, in this example, the parameter 252 continues to rise past the first excursion threshold 206. The undershoot of the parameter 252 below the regulation value 204 is shown as $\Delta V_2$ or $\Delta I_2$, depending on whether the parameter 252 represents battery 104 voltage or current, respectively. At time 256, the parameter 252 settles as the interrupt is serviced and/or the regulating IC 102 operates to hold the parameter 252 at the regulation value 204. The time period from when the parameter 252 exceeds the regulation value 204 (at time 254) to when the interrupt being serviced/or the regulating IC 102 regulates the parameter 252 at the regulation value 204 (at time 256) is shown as Δt.

As explained above, it is beneficial to reduce both the time elapsed prior to regulation of the battery 104 voltage and/or current taking over (Δt) as well as the overshoot and undershoot of the parameter 252 ($\Delta V_1/\Delta V_2$ or $\Delta I_1/\Delta I_2$). In accordance with examples of this disclosure, the regulating IC 102 reduces both Δt as well as $\Delta V_1/\Delta V_2$ or $\Delta I_1/\Delta I_2$, which results in a reduced likelihood of triggering more severe under-current, over-current, under-voltage, or over-voltage protections, as well as a reduced likelihood of turning the power converter off in order to protect the battery 104. For example, FIG. 2c shows a set of waveforms 270, which is zoomed in around the regulation value 204. In FIG. 2c, a regulated value or parameter 272 is one of a battery 104 voltage or a battery 104 current as explained above. In FIG. 2c, an upper excursion value 274 is shown in relation to the regulation value 204. In one example, the upper excursion value 274 is a percentage greater than the regulation value 204, which, as shown in FIG. 2c, is x % greater than the regulation value 204. When the parameter 272 exceeds the upper excursion value 274, the regulating IC 102 begins to operate to regulate the parameter 272 to the regulation value 204. Unlike the example of FIG. 2b, in which a relatively slow interrupt-based regulation process is employed to regulate the parameter 252, the regulating IC 102 more quickly regulates the parameter 272, which will be described in further detail below. These and other benefits are explained more fully below with respect to exemplary schematic diagrams of the regulating IC 102.

Figure 3:
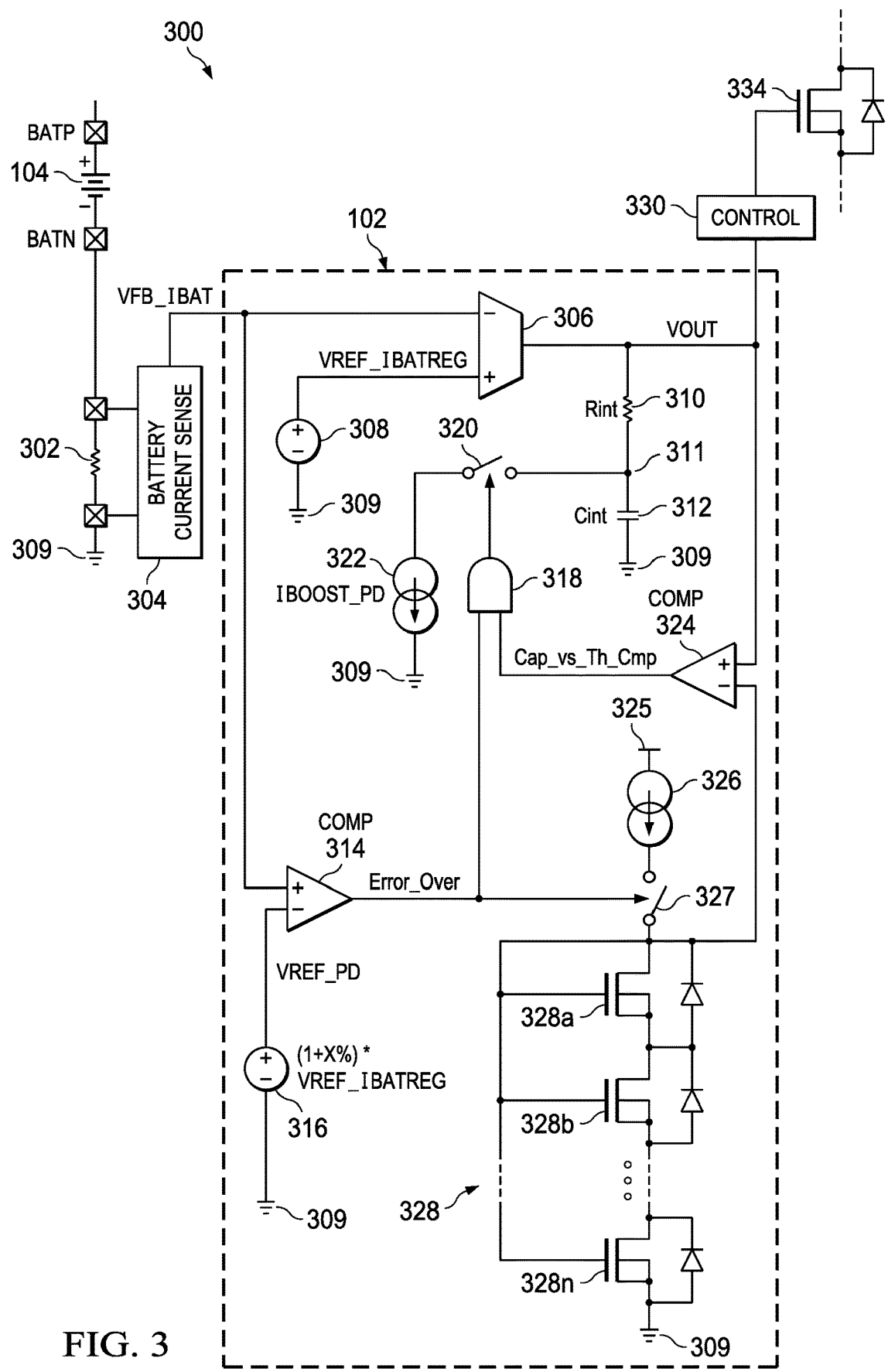
FIG. 3 shows an example schematic diagram of the regulating IC in accordance with various examples.

FIG. 3 shows a circuit schematic diagram of a system 300, including the battery 104 and the regulating IC 102, in accordance with examples of this disclosure. The battery 104 is coupled to a current sense resistor 302. A power field-effect transistor (FET) 334 controls a current flowing from a power converter (not shown for simplicity) to the battery 104 and through the current sense resistor 302. In the example of FIG. 3, the regulated parameter is a current provided to the battery 104. Thus, a battery current sense circuit 304 is coupled to the current sense resistor 302 and senses a voltage across the current sense resistor 302. The battery current sense circuit 304 generates a battery parameter (e.g., current) feedback voltage (VFB_IBAT, which also refers to the node at that voltage) that is based on (e.g., proportional to) the voltage across the current sense resistor 302.

In another example, the regulated parameter is a voltage provided to the battery 104, and thus the battery current sense circuit 304 is replaced with a battery voltage sense circuit. Although not shown in FIG. 3 for simplicity, the battery voltage sense circuit would be coupled to terminals of the battery 104 (e.g., BATP and BATN) and thus senses a voltage across the battery 104. The battery voltage sense circuit generates a battery voltage feedback voltage (VFB_VBAT, which also refers to the node at that voltage) that is based on (e.g., proportional to) the voltage across the battery 104. In the example in which the regulated parameter is the battery 104 voltage, the remainder of FIG. 3, explained further below, functions in a similar manner to regulate the battery 104 voltage.

Referring again to the example in which the regulated parameter is current provided to the battery 104, the regulating IC 102 includes an operational transconductance amplifier 306 comprising two inputs: an inverting input that is configured to couple to a battery parameter (e.g., current) feedback node (VFB_IBAT), and a non-inverting input configured to couple to a battery parameter (e.g., battery current) regulation voltage source 308, which is in turn coupled to a ground node 309. The battery current regulation voltage source 308 provides a voltage VREF_IBATREG, whose value is correlated to a value of current supplied to the battery 104 when the regulating IC 102 is operating to regulate the parameter 252, described above. For example, if the parameter 272 is battery 104 current, the regulation value 204 is 1 amp (A), and the current sense resistor 302 has a resistance of 0.01Ω, an input voltage to the battery current sense circuit 304 is 0.01 volt (V). In this example, the battery current sense circuit 304 is configured to generate an output that is eight times its input voltage, and thus generates an output voltage of 0.08V. Thus, VREF_IBATREG would also be set to 0.08V, which corresponds to a regulation value 204 for battery 104 current of 1 A.

The operational transconductance amplifier 306 is configured to generate an output current that is proportional to the difference of its input voltages. An output of the operational transconductance amplifier 306 is coupled to a resistor (Rint) 310, which is coupled to a first node 311. A capacitor (Cint) 312 is coupled to the first node 311 and to the ground node 309. The output of the operational transconductance amplifier 306 is also an output of the regulating IC 102 and is labeled VOUT.

The regulating IC 102 also includes a first comparator (COMP) 314 comprising two inputs: a non-inverting input configured to couple to the battery current feedback node (VFB_IBAT) and an inverting input configured to couple to a battery parameter (e.g., current) threshold voltage source 316, which is in turn coupled to the ground node 309. The battery current threshold voltage source 316 provides a voltage VREF_PD, whose value is related to VREF_IBATREG, described above. In one example, VREF_PD is a certain percentage greater than VREF_IBATREG and thus defines the upper excursion value 274, in relation to the regulation value 204. An output of the first comparator 314 is coupled to a first input of an AND gate 318 as well as to a control terminal of a second switch 327, which will be explained further below.

The regulating IC 102 also includes a second comparator 324 comprising two inputs: a non-inverting input coupled to the output of the operational transconductance amplifier 306 (VOUT) and an inverting input coupled to a transistor stack 328, which is in turn coupled to the ground node 309. An output of the second comparator 324 (Cap_vs_Th_Cmp) is coupled to a second input of the AND gate 318. An output of the AND gate 318 is coupled to a control terminal of a first switch 320 (e.g., a transistor), which selectively couples the first node 311 to a current sink (BOOST_PD) 322. The current sink 322 is also coupled to the ground node 309.

As explained above, the output of the first comparator 314 is coupled to the control terminal of the second switch 327. The second switch 327 is coupled to the transistor stack 328, as well as a current source 326. The current source 326 is also coupled to a supply node 325. The transistor stack 328 comprises a plurality of transistors 328a-328n, each of which is a replica of the same type as the power FET 334. In one example, the transistors 328a-328n comprise n-type metal-oxide-semiconductor field-effect transistors (MOSFETs) The transistors 328a-328n are described in further detail below.

In some examples, the output of the operational transconductance amplifier 306 is an output of the regulating IC 102 (VOUT), which is configured to couple to an input of a power FET control circuit 330, which drives a control terminal (e.g., a gate) of the power FET 334. The power FET control circuit 330 is thus configured to control a voltage to a gate of the power FET 334 to cause the power FET 334 to increase or decrease the amount of current provided to the battery 104 by modulating the resistivity of this device. In response to an increase in the value of VOUT, the power FET control circuit 330 increases the voltage provided to the gate of the power FET 334. Similarly, in response to a decrease in the value of VOUT, the power FET control circuit 330 decreases the voltage provided to the gate of the power FET 334.

During operation of the regulating IC 102, when the current provided to the battery 104 is below the regulation value 204, a voltage across the current sense resistor 302 causes the battery current sense circuit 304 to generate a voltage VFB_IBAT that is less than to the voltage provided by the battery current regulation voltage source 308, VREF_IBATREG. As a result, the operational transconductance amplifier 306 provides current (e.g., proportional to the difference between VREF_IBATREG and VFB_IBAT) to the resistor 310, and thus the voltage VOUT is relatively constant at its maximum possible value. As a result, the power FET control circuit 330 provides a maximum gate voltage to the power FET 334 that corresponds to the power FET 334 providing current to the battery 104, where the parameter (e.g., current) 202 is at an unregulated value (less than regulation value 204). Additionally, as a result of VFB_IBAT being less than the battery current threshold voltage source 316 voltage, VREF_PD, the output of first comparator 314 is not asserted. Thus, the output of AND gate 318 is not asserted, and the first switch 320 is open. If the current provided to the battery 104 is below the regulation value 204, the operational transconductance amplifier 306 provides current to the resistor 310, which induces a proportional voltage across the resistor 310, increasing the voltage VOUT as a result. In response to an increase in VOUT, the power FET control circuit 330 increases the gate voltage of the power FET 334 (e.g., to turn the power FET 334 fully on).

However, when the current provided to the battery 104 increases above the regulation value 204, a voltage across the current sense resistor 302 causes the battery current sense circuit 304 to generate a voltage VFB_IBAT that is greater than the voltage provided by the battery current regulation voltage source 308, VREF_IBATREG. As a result, the operational transconductance amplifier 306 sinks a current proportional to the difference between VFB_IBAT and VREF_IBATREG, which causes the capacitor 312 to discharge, reducing the voltage VOUT, which causes the power FET control circuit 330 to reduce the gate voltage provided to the power FET 334 to attempt to limit the current provided to the battery 104. However, the capacitor 312 discharges relatively slowly, which results in the power FET control circuit 330 not being able to quickly regulate the gate of the power FET 334 to limit the current provided to the battery 104. At this point, VFB_IBAT is still less than the battery current threshold voltage source 316 voltage, VREF_PD, and thus the output of first comparator 314 is not asserted. Thus, the output of AND gate 318 is also not asserted, and the first switch 320 is open.

When the current provided to the battery 104 increases above the upper excursion value 274, a voltage across the current sense resistor 302 causes the battery current sense circuit 304 to generate a voltage VFB_IBAT that is greater than the voltage provided by the battery current threshold voltage source 316 voltage, VREF_PD. As a result, the output of the first comparator 314 is asserted. Additionally, the output of the second comparator 324 is already asserted because the voltage VOUT is higher than the voltage at the drain of transistor 328a. Thus, the output of the AND gate 318 is also asserted, which closes the first switch 320. When the first switch 320 is closed, a discharge path exists between the ground node 309 and the capacitor 312. Further, the current sink 322 accelerates and boosts the discharging of the capacitor 312, which causes the power FET control circuit 330 to more quickly reduce the gate voltage of the power FET 334, and thus the current provided to the battery 104.

When the output of the first comparator 314 is asserted, the second switch 327 also closes, and thus the current source 326 provides a current to the transistor stack 328. The transistors 328a-n of the transistor stack 328 are series connected devices, in which the gates of transistors 328a-n are coupled to the drain of the transistor 328a. The value of the current provided by the current source 326 is selected such that the current density through the transistors 328a-n is approximately equal to the current density through the power FET 334 when providing a current corresponding to the regulation value 204 to the battery 104. As a result, when the current source 326 provides current to the transistor stack 328, a voltage is generated across the transistor stack 328 that corresponds to the input voltage that causes the power FET control circuit 330 to operate power FET 334 in order to provide the current corresponding to the regulation value 204 to the battery 104. In addition, because the transistors 328a-n are replicas of the power FET 334, the voltage generated across the transistor stack 328 will vary (e.g., with process and temperature variations) correspondingly with the voltage that, when provided to the gate of power FET 334, causes the power FET 334 to provide the current corresponding to the regulation value 204 to the battery 104. As a result, the influence of process and temperature variations on the control of the power FET 334 is reduced.

The output of the second comparator 324 remains asserted until the voltage VOUT falls below the voltage across the transistor stack 328 as the capacitor 312 discharges through the first switch 320 and the current sink 322. The output of the second comparator 324 is de-asserted when VOUT falls below the voltage across the transistor stack 328, which corresponds to a voltage that, when provided to the power FET control circuit 330, causes the power FET 334 to provide a current corresponding to the regulation value 204 to the battery 104. When the output of the second comparator 324 is de-asserted, the output of the AND gate 318 is de-asserted, and thus the first switch 320 opens, which stops the pull-down discharging (e.g., boosted pull-down) of the capacitor 312.

The pull-down discharging of the capacitor 312 reduces the amount of time to regulate the power FET 334 to reduce the current provided to the battery 104 to the regulation value 204. Further, by stopping the pull-down discharging of the capacitor 312 as described above, undershoot below the regulation value 204 of the current provided to the battery 104 is reduced.

As explained above, the regulating IC 102 shown in FIG. 3 uses a pull-down boost mechanism (e.g., the first switch 320 and current sink 322) to regulate the power FET 334 based on a voltage provided to the battery 104 or a current provided to the battery 104. For example, where the regulation is based on the current provided to the battery 104, the battery current sense circuit 304 generates a battery current feedback voltage that is based on (e.g., proportional to) the voltage across a current sense resistor 302. In another example, where the regulation is based on the voltage provided to the battery 104, a battery voltage sense circuit (not shown in FIG. 3 for simplicity) generates a battery voltage feedback voltage that is based on (e.g., proportional to) the voltage across the battery 104. However, in another example, the regulating IC 102 regulates the power FET 334 based on both the voltage and current provided to the battery 104.

Figure 4:
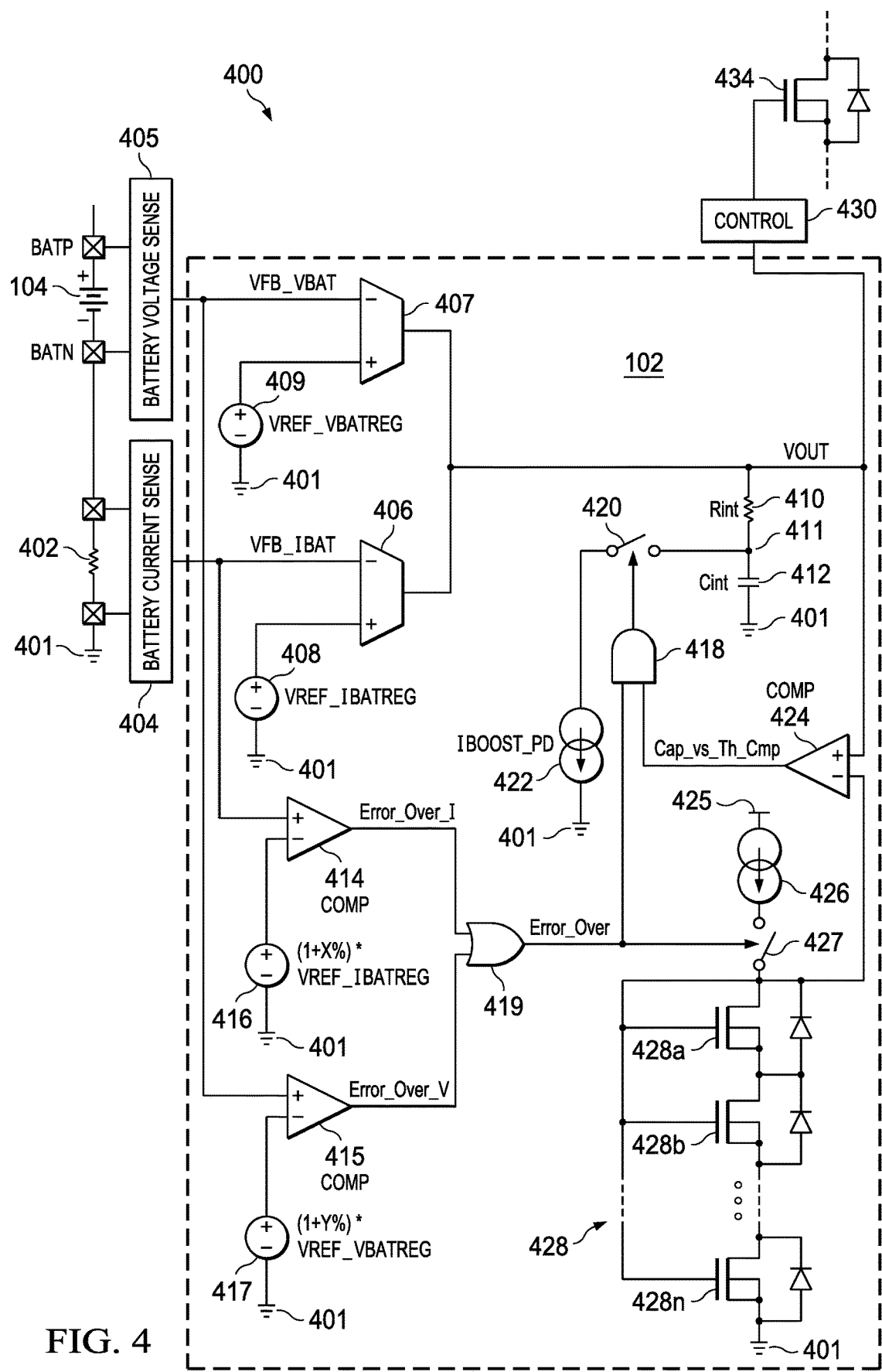
FIG. 4 shows another example schematic diagram of a regulating IC in accordance with various examples.

FIG. 4 shows an example system 400 that enables regulation of a power FET 434 based on both the voltage and current provided to a battery 104. For example, a first portion of the regulating IC 102 senses the voltage and current provided to the battery 104. In particular, the first portion includes a battery current sense circuit 404 (e.g., similar to the battery current sense circuit 304, described above) coupled to a current sense resistor 402. Additionally, the first portion includes a battery voltage sense circuit 405 coupled to the terminals of the battery 104 (e.g., BATP and BATN). Both the battery current and voltage sense circuits 404, 405 function similarly, in that they generate a feedback voltage (VFB_IBAT and VFB_VBAT, respectively) that is based on (e.g., proportional to) the voltage across the current sense resistor 402 and the battery 104, respectively.

The first portion also includes a first operational transconductance amplifier 406 comprising two inputs: an inverting input that is configured to couple to a battery current feedback node (VFB_IBAT), and a non-inverting input configured to couple to a battery current regulation voltage source 408 (which provides the voltage VREF_IBATREG), which is in turn coupled to a ground node 401. The portion 400 also includes a second operational transconductance amplifier 407 comprising two inputs: an inverting input that is configured to couple to a battery voltage feedback node (VFB_VBAT), and a non-inverting input configured to couple to a battery voltage regulation voltage source 409 (which provides the voltage VREF_VBATREG), which is in turn coupled to a ground node 401.

The battery current regulation voltage source 408 provides a voltage VREF_IBATREG, whose value is correlated to a value of current supplied to the battery 104 when the regulating IC 102 is operating to regulate the current, described above. Similarly, the battery voltage regulation voltage source 409 provides a voltage VREF_VBATREG, whose value is correlated to a value of voltage supplied to the battery 104 when the regulating IC 102 is operating to regulate the voltage, described above.

The operational transconductance amplifiers 406, 407 are each configured to generate an output current that is proportional to the difference of their input voltages. In the example of FIG. 4, the outputs of operational transconductance amplifiers 406, 407 are coupled, which sums the currents produced (or sunk) by the operational transconductance amplifiers 406, 407. The common output is labeled VOUT, and is coupled to a resistor 410, which is coupled to a first node 411. A capacitor 412 is coupled to the first node 411 and to the ground node 401. The output VOUT is also an output of the regulating IC 102, as explained above.

A second portion of the regulating IC 102 is configured to compare the battery current feedback voltage (VFB_IBAT) and the battery voltage feedback voltage (VFB_VBAT) with upper excursion thresholds to control pull-down discharging (e.g., boosted pull-down) of the capacitor 412, as explained above. Thus, the second portion includes a first comparator 414 comprising two inputs: a non-inverting input configured to couple to the battery current feedback node (VFB_IBAT) and an inverting input configured to couple to a battery current threshold voltage source 416, which is in turn coupled to the ground node 401. The second portion also includes a second comparator 415 comprising two inputs: a non-inverting input configured to couple to the battery voltage feedback node (VFB_VBAT) and an inverting input configured to couple to a battery voltage threshold voltage source 417, which is in turn coupled to the ground node 401.

The battery current threshold voltage source 416 provides a voltage whose value is related to VREF_IBATREG (e.g., is X % greater than), described above. The battery current threshold voltage source 416 thus defines the upper excursion value 274, in relation to the regulation value 204 for a current parameter. An output of the first comparator 414 is coupled to a first input of an OR gate 419. The battery voltage threshold voltage source 417 provides a voltage whose value is related to VREF_VBATREG (e.g., is Y % greater than), described above. The battery voltage threshold voltage source 417 thus defines the upper excursion value 274, in relation to the regulation value 204 for a voltage parameter. An output of the second comparator 415 is coupled to a second input of the OR gate 419.

The first and second portions produce the nodes VOUT and Error_Over, respectively, which couple to the remainder of the system 400, which is similar to that described above with respect to FIG. 3. In particular, the remainder of the system 400 includes elements that are numbered in a similar fashion to those described above in FIG. 3, and which function similarly to those elements described above in FIG. 3. For example, the first switch 420 and the current sink 422 similarly couple to the first node 411, while VOUT couples to the power FET control circuit 430, similar to the power FET control circuit 330 in FIG. 3.

During operation of the system 400, when the current and voltage provided to the battery 104 are below their respective regulation values, the battery current sense circuit 404 generates a voltage VFB_IBAT that is less than to the voltage provided by the battery current regulation voltage source 408, VREF_IBATREG. Similarly, the battery voltage sense circuit 405 generates a voltage VFB_VBAT that is less than to the voltage provided by the battery voltage regulation voltage source 409, VREF_VBATREG. As a result, the first operational transconductance amplifier 406 provides current (e.g., proportional to the difference between VREF_IBATREG and VFB_IBAT), while the second operational transconductance amplifier 407 provides current (e.g., proportional to the difference between VREF_VBATREG and VFB_VBAT) to the resistor 410, and thus the voltage VOUT is relatively constant at its maximum possible value.

As a result, the power FET control circuit 430 provides a maximum gate voltage to the power FET 434 that corresponds to the power FET 434 providing current and voltage to the battery 104 at an unregulated value. Additionally, because VFB_IBAT is less than the battery current threshold voltage source 416 voltage, and VFB_VBAT is less than the battery voltage threshold voltage source 417, the output of comparators 414, 415 are not asserted, and thus the output of the OR gate 419 is not asserted. As a result, the output of AND gate 418 (to which the output of the OR gate 419 is an input) is not asserted, and the first switch 420 is open.

However, when the current provided to the battery 104 increases above its regulation value, a voltage across the current sense resistor 402 causes the battery current sense circuit 404 to generate a voltage VFB_IBAT that is greater than the voltage provided by the battery current regulation voltage source 408, VREF_IBATREG. Similarly, when the voltage provided to the battery 104 increases above its regulation value, a voltage across the battery 104 causes the battery voltage sense circuit 405 to generate a voltage VFB_VBAT that is greater than the voltage provided by the battery voltage regulation voltage source 409, VREF_VBATREG. As a result, the first operational transconductance amplifier 406 and/or the second operational transconductance amplifier 407 sinks a current proportional to the difference between VFB_IBAT and VREF_IBATREG, or to the difference between VFB_VBAT and VREF_VBATREG, respectively, which causes the capacitor 412 to discharge, reducing the voltage VOUT, which causes the power FET control circuit 430 to reduce the gate voltage provided to the power FET 434 to attempt to limit the current and/or voltage provided to the battery 104. However, the capacitor 412 discharges relatively slowly, which results in the power FET control circuit 430 not being able to quickly regulate the gate of the power FET 434 to limit the current provided to the battery 104. At this point, VFB_IBAT is still less than the battery current threshold voltage source 416 voltage, while VFB_VBAT is still less than the battery voltage threshold voltage source 417 voltage, and thus the output of the OR gate 419 is not asserted. As a result, the output of AND gate 418 is also not asserted, and the first switch 420 is open.

When the current provided to the battery 104 increases above its upper excursion value 274, a voltage across the current sense resistor 402 causes the battery current sense circuit 404 to generate a voltage VFB_IBAT that is greater than the voltage provided by the battery current threshold voltage source 416 voltage. As a result, the output of the first comparator 414 is asserted. Additionally or alternately, when the voltage provided to the battery 104 increases above its upper excursion value 274, the battery voltage sense circuit 405 generates a voltage VFB_VBAT that is greater than the voltage provided by the battery voltage threshold voltage source 417 voltage. As a result, the output of the second comparator 415 is asserted. In response to the output of the first comparator 414 and/or the output of the second comparator 415 being asserted, the output of the OR gate 419 is also asserted.

Additionally, the output of the second comparator 424 is already asserted as explained above. Thus, the output of the AND gate 418 is asserted in response to the output of the OR gate 419 being asserted, which closes the first switch 420. When the first switch 420 is closed, a discharge path exists between the ground node 401 and the capacitor 412. Further, the current sink 422 accelerates and boosts the discharging of the capacitor 412, which causes the power FET control circuit 430 to more quickly reduce the gate voltage of the power FET 434, and thus the current and/or voltage provided to the battery 104.

As explained in this example, the output of the OR gate 419 in FIG. 4b replaces the output of the first comparator 314 shown in FIG. 3. Thus, when the output of the OR gate 419 is asserted, the second switch 427 also closes, and thus the current source 426 provides a current to the transistor stack 428. As explained above, when the current source 426 provides current to the transistor stack 428, a voltage is generated across the transistor stack 428 that corresponds to the input voltage that causes the power FET control circuit 430 to operate power FET 434 in order to provide the current and/or voltage corresponding to the regulation value to the battery 104.

The output of the second comparator 424 remains asserted until the voltage at VOUT falls below the voltage across the transistor stack 428 as the capacitor 412 discharges through the first switch 420 and the current sink 422. The output of the second comparator 424 is de-asserted when VOUT is less than the voltage across the transistor stack 428, which corresponds to a voltage that, when provided to the power FET control circuit 430, causes the power FET 434 to provide a current and/or voltage that corresponds to the regulation values for those parameters to the battery 104. When the output of the second comparator 424 is de-asserted, the output of the AND gate 418 is de-asserted, and thus the first switch 420 opens, which stops the pull-down discharging (e.g., boosted pull-down) of the capacitor 412.

As above, the pull-down discharging of the capacitor 412 reduces the amount of time to regulate the power FET 434 to reduce the current and/or voltage provided to the battery 104 to their regulated values. Further, by stopping the pull-down discharging of the capacitor 412 as described above, undershoot below the regulated values of the current and/or voltage provided to the battery 104 is reduced.

Figure 5:
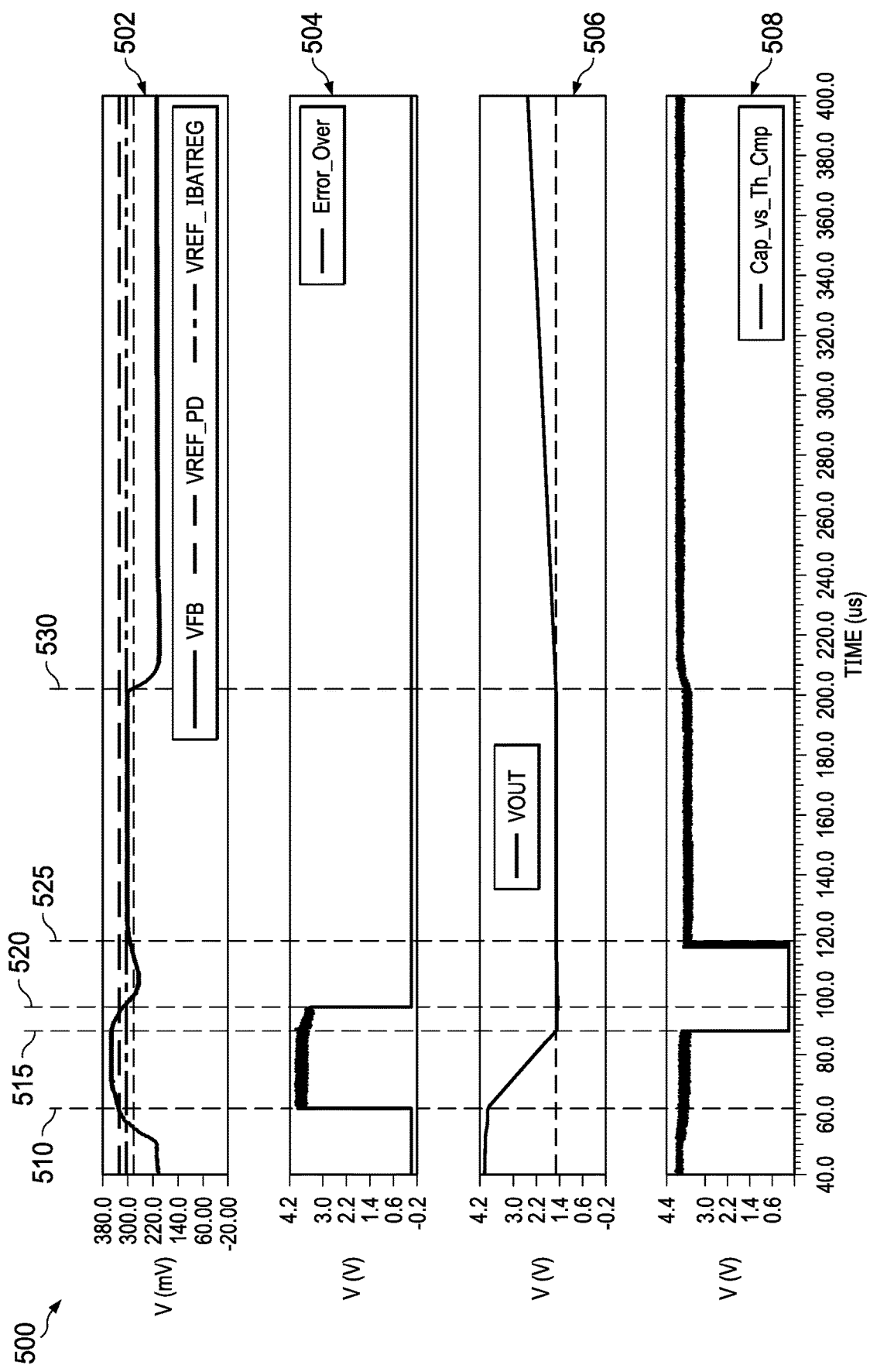
FIG. 5 shows a set of waveforms that demonstrate the functionality of the regulating IC under various conditions in accordance with various examples.

FIG. 5 shows waveforms 500 that correspond to voltages at various nodes of the regulating IC 102 shown in FIG. 3. The first waveform 502 shows the battery current sense circuit 304 output, which is the battery parameter feedback voltage, labeled VFB, as a function of time. In the first waveform 502, VFB is shown relative to the voltage levels VREF_IBATREG (e.g., provided by the battery current regulation voltage source 308) and VREF_PD (e.g., provided by the threshold voltage source 316). The second waveform 504 shows the voltage at the output of the first comparator 314, labeled Error_Over, as a function of time. The third waveform 506 shows the voltage at the output of the operational transconductance amplifier 306, labeled VOUT, as a function of time. Finally, the fourth waveform 508 shows the voltage at the output of the second comparator 324, labeled Cap_vs_Th_Cmp, as a function of time.

Initially, for example at time 0, the battery parameter feedback voltage VFB is less than the regulation voltage VREF_IBATREG, and thus the regulating IC 102 is not operating to regulate current provided to the battery 104. As a result, VFB is also less than the threshold voltage VREF_PD, and thus the output of first comparator 314 Error_Over is de-asserted. VOUT is relatively constant at its maximum possible value. As a result, the power FET control circuit 330 provides a maximum gate voltage to the power FET 334. Cap_vs_Th_Cmp is asserted as a result of VOUT being at a high value while the second switch 327 is open, which causes the top of the transistor stack 328 to be pulled down to the ground node 309.

Prior to time 510, the battery parameter feedback voltage VFB (e.g., indicative of current into the battery 104) begins to rise (e.g., due to a battery charging adapter malfunction, or a device erroneously requesting too much current). Subsequently at time 510, the battery parameter feedback voltage VFB exceeds the threshold voltage VREF_PD. VFB exceeding VREF_PD causes the output of the first comparator 314 to be asserted, which is demonstrated in the second waveform 504 in which Error_Over transitions from a low voltage to a high voltage. As explained above, when Error_Over is asserted, the first switch 320 closes and the current sink 322 accelerates and boosts the discharging of the capacitor 312 (and thus VOUT), which causes the power FET control circuit 330 to more quickly reduce the gate voltage of the power FET 334, and thus the current provided to the battery 104. The third waveform 506 demonstrates the boosted pulldown of VOUT after time 510. When Error_O- ver is asserted, the second switch 327 also closes and a voltage is developed across the transistor stack 328 as explained above. The voltage value across the transistor stack 328 is shown as a dashed line in the third waveform 506. While VOUT is greater than the dashed line, the output of the second comparator 324 remains asserted as demonstrated in the fourth waveform 508. However, when VOUT reaches the voltage across the transistor stack 328 at time 515, the output of the second comparator 324 is de-asserted, which causes the first switch 320 to open, stopping the boosted pulldown.

At time 515, although the battery parameter feedback voltage VFB is decreasing, VFB is still greater than the threshold voltage VREF_PD, and thus Error_Over remains asserted. However, at time 520, VFB falls below the threshold voltage VREF_PD and thus the output of the first comparator 314 Error_Over is de-asserted. At time 525, the voltage across the transistor stack 328 is discharged to less than VOUT, which causes the output of the second comparator 324 to be asserted, reflected in the fourth waveform 508. Between time 525 and 530, the battery parameter feedback voltage VFB is held to the regulated voltage VREF_IBATREG by maintaining VOUT as explained above (e.g., using the operational transconductance amplifier 306 feedback). Finally, at time 530, the battery parameter feedback voltage VFB falls below the regulated voltage VREF_IBATREG (e.g., due to a battery charge profile tapering off, or system transients settling), and thus VOUT begins to rise as the operational transconductance amplifier 306 charges the capacitor 312.

In the foregoing discussion, the terms "including" and "comprising" are used in an open-ended fashion, and thus should be interpreted to mean "including, but not limited to . . . ." The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

What is claimed is:

1. A device comprising:
an operational amplifier having:
an inverting input adapted to couple to a battery parameter node;
a non-inverting input adapted to couple to a battery parameter regulation voltage source; and
an output;
a switch coupled to the output of the operational amplifier and to a current sink;
a logic gate having a first input, a second input, and an output, the output of the logic gate coupled to a control terminal of the switch; and
a comparator having:
a non-inverting input coupled to the battery parameter node;
an inverting input adapted to couple to a battery parameter threshold voltage source; and
an output coupled to the first input of the logic gate.

2. The device of claim 1, wherein the switch is configured to:
close in response to the output of the logic gate being asserted; and
open in response to the output of the logic gate being de-asserted.

3. The device of claim 1, wherein a voltage received at the inverting input of the comparator is greater than a voltage received at the non-inverting input of the operational amplifier.

4. The device of claim 1, wherein a voltage at the battery parameter node indicates a current provided to a battery.

5. The device of claim 1, wherein a voltage at the battery parameter node indicates a voltage provided to a battery.

6. The device of claim 1, wherein the comparator is a first comparator and the switch is a first switch, the device further comprising:
a transistor stack;
a second comparator having:
a non-inverting input coupled to the output of the operational amplifier;
an inverting input coupled to the transistor stack; and
an output coupled to the second input of the logic gate; and
a second switch coupled to the transistor stack, the second switch having a control terminal coupled to the output of the first comparator.

7. The device of claim 6, wherein the second switch is configured to:
close in response to the output of the first comparator being asserted; and
open in response to the output of the first comparator being de-asserted.

8. The device of claim 6, wherein the transistor stack comprises n-type metal—oxide—semiconductor field-effect transistors (MOSFETs).

9. The device of claim 8, wherein the n-type MOSFETs comprise replica transistors of a power transistor coupled to a battery.

10. A device comprising:
a first operational amplifier having:
an inverting input coupled to a current node;
a non-inverting input adapted to couple to a battery current regulation voltage source; and
an output;

a second operational amplifier having:
an inverting input coupled to a voltage node;
a non-inverting input adapted to couple to a battery voltage regulation voltage source; and
an output;
a switch coupled to the output of the first operational amplifier and to the second operational amplifier; and
a logic gate having a first input, a second input, and an output, the output of the logic gate coupled to a control terminal of the switch.

11. The device of claim 10, wherein the switch is configured to:
close in response to the output of the logic gate being asserted; and
open in response to the output of the logic gate being de-asserted.

12. The device of claim 10, wherein the switch is a first switch and the logic gate is a first logic gate, the device further comprising:
a second logic gate having a first input, a second input, and an output, the output of the second logic gate coupled to the first input of the first logic gate;
a first comparator having:
a non-inverting input coupled to the current node;
an inverting input adapted to couple to a battery current threshold voltage source; and
an output coupled to the first input of the second logic gate;
a second comparator having:
a non-inverting input coupled to the voltage node;
an inverting input adapted to couple to a battery voltage threshold voltage source; and
an output coupled to the second input of the second logic gate;
a third comparator having:
a non-inverting input coupled to the output of the first operational amplifier and to the output of the second operational amplifier;
an inverting input; and
an output coupled to the second input of the first logic gate; and
a second switch coupled to the inverting input of the third comparator, the second switch having a control terminal coupled to the output of the second logic gate.

13. The device of claim 12, wherein the second switch is configured to:
close in response to the output of the second logic gate being asserted; and
open in response to the output of the second logic gate being de-asserted.

14. The device of claim 12, further comprising a transistor stack coupled to the second switch and to the inverting input of the third comparator, wherein the transistor stack comprises n-type metal—oxide—semiconductor field-effect transistors (MO SFETs).

15. The device of claim 14, wherein the n-type MOSFETs comprise replica transistors of a power transistor coupled to a battery.

16. The device of claim 12, wherein a voltage supplied by the battery current threshold voltage source is greater than a voltage supplied by the battery current regulation voltage source.

17. The device of claim 12, wherein a voltage supplied by the battery voltage threshold voltage source is greater than a voltage supplied by the battery voltage regulation voltage source.

18. A device comprising:
an operational amplifier configured to generate a current at an output based on a voltage indicative of a parameter provided to a battery and a voltage provided by a battery parameter regulation voltage source;
a switch coupled to the output of the operational amplifier;
a logic gate having a first input, a second input, and an output, the output of the logic gate coupled to a control terminal of the switch; and
a comparator configured to assert an output in response to the voltage indicative of the parameter being greater than a battery parameter threshold, wherein the output of the comparator is coupled to the first input of the logic gate.

19. The device of claim 18, wherein the switch is configured to:
close in response to the output of the logic gate being asserted; and
open in response to the output of the logic gate being de-asserted.

20. The device of claim 18, wherein the comparator is a first comparator and the switch is a first switch, the device further comprising:
a second comparator configured to assert an output in response to a voltage at the output of the operational amplifier being greater than a voltage across a transistor stack, wherein the output of the second comparator is coupled to the second input of the logic gate; and
a second switch coupled to the transistor stack, the second switch having a control terminal coupled to the output of the first comparator.

21. The device of claim 20, wherein the second switch is configured to:
close in response to the output of the first comparator being asserted; and
open in response to the output of the first comparator being de-asserted.

22. The device of claim 20, wherein the transistor stack comprises n-type metal—oxide—semiconductor field-effect transistors (MOSFETs).

23. The device of claim 22, wherein the n-type MOSFETs comprise replica transistors of a power transistor coupled to the battery.

* * * * *